(12) United States Patent
Yoshikawa et al.

(10) Patent No.: US 8,012,530 B2
(45) Date of Patent: Sep. 6, 2011

(54) ORGANIC THIN-FILM PHOTOELECTRIC CONVERSION ELEMENT AND METHOD OF MANUFACTURING THE SAME

(75) Inventors: Susumu Yoshikawa, Ikeda (JP); Kaku Uehara, Sakai (JP); Akinobu Hayakawa, Kyoto (JP)

(73) Assignee: Kyoto University, Kyoto (JP)

( * ) Notice: Subject to any disclaimer, the term of this patent is extended or adjusted under 35 U.S.C. 154(b) by 371 days.

(21) Appl. No.: 11/991,365

(22) PCT Filed: Sep. 6, 2006

(86) PCT No.: PCT/JP2006/317673
§ 371 (c)(1),
(2), (4) Date: Mar. 3, 2008

(87) PCT Pub. No.: WO2007/029750
PCT Pub. Date: Mar. 15, 2007

(65) Prior Publication Data
US 2009/0151787 A1    Jun. 18, 2009

(30) Foreign Application Priority Data

Sep. 6, 2005    (JP) .................................. 2005-258527
Mar. 10, 2006   (JP) .................................. 2006-066674

(51) Int. Cl.
*B05D 5/12*   (2006.01)
*H01L 31/00*  (2006.01)
(52) U.S. Cl. ........................... 427/74; 427/350; 136/263
(58) Field of Classification Search .............. 427/74–76, 427/350; 136/263
See application file for complete search history.

(56) References Cited

U.S. PATENT DOCUMENTS 6,559,375 B1 *   5/2003   Meissner et al. .............. 136/263
(Continued)

FOREIGN PATENT DOCUMENTS

JP    A-08-217577    8/1996
(Continued)

OTHER PUBLICATIONS

Kwong et al. ("Influence of solvent on film morphology and device performance pf poly(3-hexylthiophene):TiO2 nanocomposite solar cells"), Chemical Physics Letters 384 p. 372-375, Jan. 2004.*

(Continued)

*Primary Examiner* — James Lin
(74) *Attorney, Agent, or Firm* — Oliff & Berridge, PLC (57) ABSTRACT

The objectives of the present invention are to enable the manufacturing of an organic thin-film photoelectric conversion element under normal atmosphere, improve the photoelectric conversion efficiency of the element, and enhance its durability. A hole-blocking TiO2 layer is created between the photoelectric conversion layer and the electrode by a wet process. In the manufacturing process, the hole-blocking TiO2 layer is air-dried so that it will be an amorphous layer. It is possible to provide a concentration gradient layer of PCBM/P3HT in which the PCBM concentration is higher in a region close to the hole-blocking TiO2 layer. This structure will reduce the electric resistance of that region and minimize the current loss within the photoelectric conversion element. In the vicinity of the hole-blocking TiO2 layer, the PCBM concentration is increased, which in turn makes it easier for electrons to flow into the TiO2 layer since PCBM is electrically conductive. Due to these features, the organic thin-film photoelectric conversion element having the gradient structure of the present embodiment has a high level of photoelectric conversion efficiency and good durability.

6 Claims, 12 Drawing Sheets

U.S. PATENT DOCUMENTS

| | | | |
|---|---|---|---|
| 6,653,701 B1 * | 11/2003 | Yamazaki et al. | 257/414 |
| 2001/0055888 A1 * | 12/2001 | Madan et al. | 438/758 |
| 2004/0036067 A1 * | 2/2004 | Andriessen | 257/40 |
| 2004/0187911 A1 * | 9/2004 | Gaudiana et al. | 136/252 |
| 2005/0022856 A1 | 2/2005 | Komatsu et al. | |
| 2005/0257827 A1 | 11/2005 | Gaudiana et al. | |
| 2005/0268962 A1 | 12/2005 | Gaudiana et al. | |
| 2006/0011233 A1 | 1/2006 | Sariftci et al. | |
| 2006/0076048 A1 | 4/2006 | Gaudiana et al. | |

FOREIGN PATENT DOCUMENTS

| | | |
|---|---|---|
| JP | A-2003-123856 | 4/2003 |
| JP | A-2004-273423 | 9/2004 |
| JP | A-2004-319705 | 11/2004 |
| JP | A-2005-032793 | 2/2005 |
| JP | A-2005-158972 | 6/2005 |
| JP | A-2005-235794 | 9/2005 |
| JP | A-2005-526404 | 9/2005 |
| WO | WO 03/098715 A1 | 11/2003 |

OTHER PUBLICATIONS

Dittmer, J.J.; Solar Energy Materials and Solar Cells; "Crystal network formation in organic solar cells"; 61(1), p. 53-61; 2000.*

Tobias Erb et al.; "Correlation Between Structural and Optical Properties of Composite Polymer/Fullerene Films for Organic Solar Cells;" *Advanced Functional Materials*; 2005, 15, 1193-1196.

* cited by examiner

SPIN-COATED WITH P3HT CHLOROBENZENE SOLUTION

SPIN-COATED WITH
P3HT:PCBM CHLOROBENZENE SOLUTION

ORGANIC THIN-FILM PHOTOELECTRIC CONVERSION ELEMENT AND METHOD OF MANUFACTURING THE SAME

TECHNICAL FIELD

The present invention relates to an organic thin-film photoelectric conversion element using an organic thin-film as the generation layer and a method of manufacturing such an element. The photoelectric conversion element according to the present invention has a high level of photoelectric conversion efficiency and is suitable for solar cells.

BACKGROUND ART

Compared to currently used semiconductor (silicon) photoelectric conversion elements, the organic thin-film photoelectric conversion element is more flexible and has a broader range of applications with various shapes and colors. Due to these features, the element is regarded as a highly promising device that can be used in various locations of different conditions. Another attractive point is that the active layer of this element can be efficiently manufactured by a wet process, such as spin-coating or screen-printing; this advantage will ultimately enable the mass production of the device by roll-to-roll processing and significantly reduce the production cost.

However, there are still many problems to be solved before this new device can be put into practical use. For example, the materials for this device are expensive, it must be manufactured under a vacuum or nitrogen atmosphere, and it lacks durability when used under normal atmosphere. These factors resultantly make the device very expensive.

To date, there have been various types of organic photoelectric conversion elements invented. In recent years, one type called the "bulk heterojunction" structure is particularly drawing people's attention due to its high photoelectric conversion efficiency. The element of this type is made of a conductive polymer mixed with a fullerene derivative; the former material corresponds to the p-type semiconductor of the semiconductor photoelectric conversion element and the latter corresponds to the n-type. It is believed that the heterojunction structure, in which the two materials are intricately combined, provides a good level of charge-separation efficiency. Another structure, called the "flat heterojunction cell", also exhibits similar effects. Although the following description takes the bulk heterojunction structure as an example of the photoelectric conversion layer, the description also applies to the latter structure.

The present cell structure is very simple: a substrate covered with a transparent conductive film (electrode) is spin-coated with a composite of the aforementioned two materials, on which an electrode couple is mounted.

As explainer earlier, the bulk heterojunction structure has good charge-separation efficiency. Unfortunately, the use of organic materials lowers the charge-transfer rate. One effective method for improving its overall photoelectric conversion efficiency is to make the organic layer thinner. However, too thin an organic layer will cause a charge leakage due to a short between the two electrodes and ultimately cause the reverse charge-transport. To avoid this situation, various techniques have been invented thus far.

In a conventionally known type of organic thin-film photoelectric conversion element, the photoelectric conversion efficiency is improved by creating a hole-blocking layer (i.e. a layer that allows electrons to pass through while disallowing the passage of holes) between the metal electrode and the active layer. The hole-blocking layers reported thus far are all made of TiO2 and can be manufactured by the following method: TiO2 is burned on an electrode at a temperature of 450 degrees Celsius within a vacuum chamber from which oxygen and moisture have been removed. This process creates a mesoporous hole-blocking layer of TiO2. Then, a dye layer, which will ultimately serve as the active layer, is applied onto the electrode having the hole-blocking TiO2 layer to obtain the organic thin-film photoelectric conversion element.

[Patent Document 1] Japanese Unexamined Patent Application Publication No. 2004-319705

[Non-Patent Document 1] T. Erb et al., *Adv. Funct. Mater.*, 2005, 15, 1193-1196

DISCLOSURE OF THE INVENTION

Problem to be Solved By the Invention

As stated previously, organic thin-film photoelectric conversion elements have an advantage in that their active layer can be efficiently manufactured by a spin-coating, screen-printing or similar wet process. However, in the case of the previous type of organic thin-film photoelectric conversion element, the inclusion of the burning step inevitably makes the manufacturing process more complex, lowering the manufacturing efficiency of the element and significantly increasing its production cost.

Without the hole-blocking layer, however, the organic thin-film photoelectric conversion element manufactured by normal wet processes cannot have a sufficiently high level of photoelectric conversion efficiency, which even under optimal conditions is at a level from 0.5 to 1.0% under normal atmosphere.

Means for Solving the Problems

In view of this problem, the inventors have come up with the idea that the hole-blocking layer of TiO2 between the photoelectric conversion layer and the electrode of the organic thin-film photoelectric conversion element can also be created by a wet process under normal atmosphere, as in the case of the active layer. This technique has made it possible to achieve a high level of photoelectric conversion without sacrificing the advantageous features of the organic thin-film photoelectric conversion element.

Specifically, the hole-blocking TiO2 layer of the present invention is created by applying a solution of Ti alkoxide (sol-gel) and drying it at room temperature. Spin-coating, roll-to-roll, screen-printing and similar processes are available to apply the solution.

In addition to titania (TiO2), the materials for the hole-blocking layer include niobate (Nb2O5), zirconia (ZrO2), tin oxide (SnO2), tungstic trioxide (WO3), zinc oxide (ZnO), indium oxide (In2O3), aluminum oxide (Al2O3), and mixtures of two or more of them. These materials are all stable compounds and can therefore significantly contribute to the creation of a highly stable photoelectric conversion element (particularly, a solar cell) that can long maintain its performance. Among those compounds, ZnO, Nb2O5 and SnO2 along with TiO2 are significantly effective in terms of conversion efficiency.

The process of manufacturing the organic thin-film photoelectric conversion element according to the present invention may further include the step of annealing the element at a temperature of 50 to 200 degrees Celsius for a period of time from 1 minute to five hours after the photoelectric conversion layer is created. This technique will further improve the photoelectric conversion efficiency.

Effect of the Invention

Thus, in the manufacturing of an organic thin-film solar cell with a hole-blocking TiO2 layer between the active layer and the electrode layer for improving the photoelectric conversion efficiency, the TiO2 layer can be created by a wet process. This means that the TiO2 layer can be created easily on the active layer in the manufacturing processes, whereby the organic thin-film photoelectric conversion element as a whole can be more efficiently manufactured. Moreover, the element thus produced has a high level of photoelectric conversion efficiency and good durability.

BEST MODE FOR CARRYING OUT THE INVENTION

TiO2 is known as an electron-transporting material. This function is believed to result from the fact that the electrically conductive elements of TiO2 overlap each other, which means that a large number of paths overlap each other to ensure a smooth flow of electrons. Having its lowest unoccupied molecular orbital (LUMO) at 4.2 eV and highest occupied molecular orbital (HOMO) at 7.4 eV, TiO2 is a convenient material not only for transporting electrons to the metal electrode but also as a material for blocking hole transport.

In the case where the electrode is made of aluminum, the use of TiO2 layer as the hole-blocking layer will exhibit another positive effect: The TiO2 layer prevents the corrosion of aluminum, which would otherwise take place due to a reaction between aluminum and the organic material of the active layer of the organic thin-film solar cell.

EMBODIMENTS

First Embodiment

Figure 1:
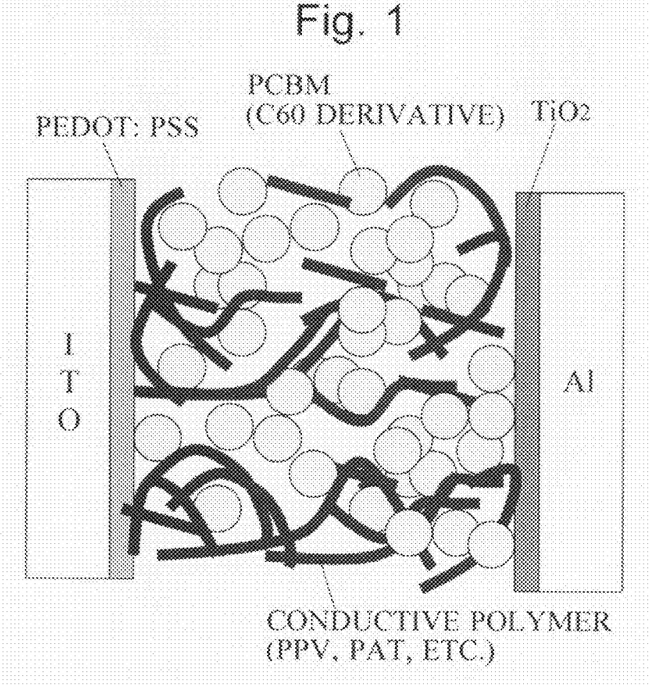
FIG. 1 is a cross-sectional view of the structure of an organic thin-film solar cell having a TiO2 layer as an embodiment of the present invention.
Figure 2:
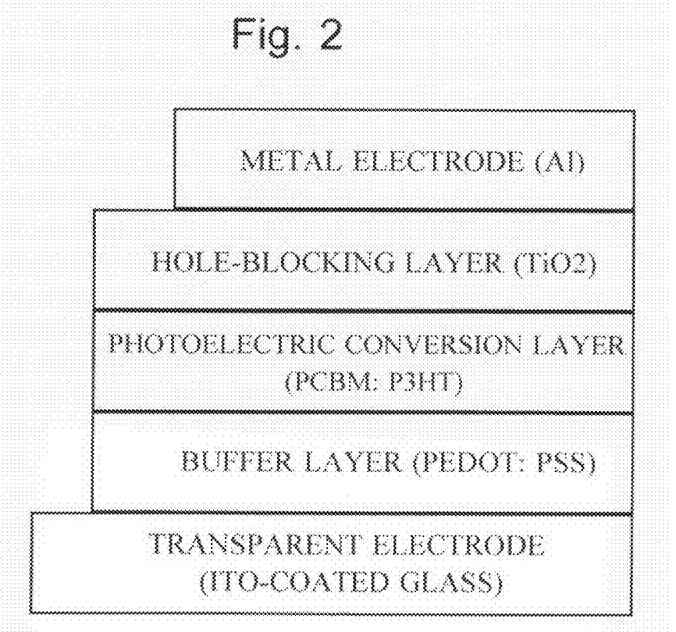
FIG. 2 is a diagram of the layer structure of the organic thin-film solar cell of the embodiment.
Figure 3:
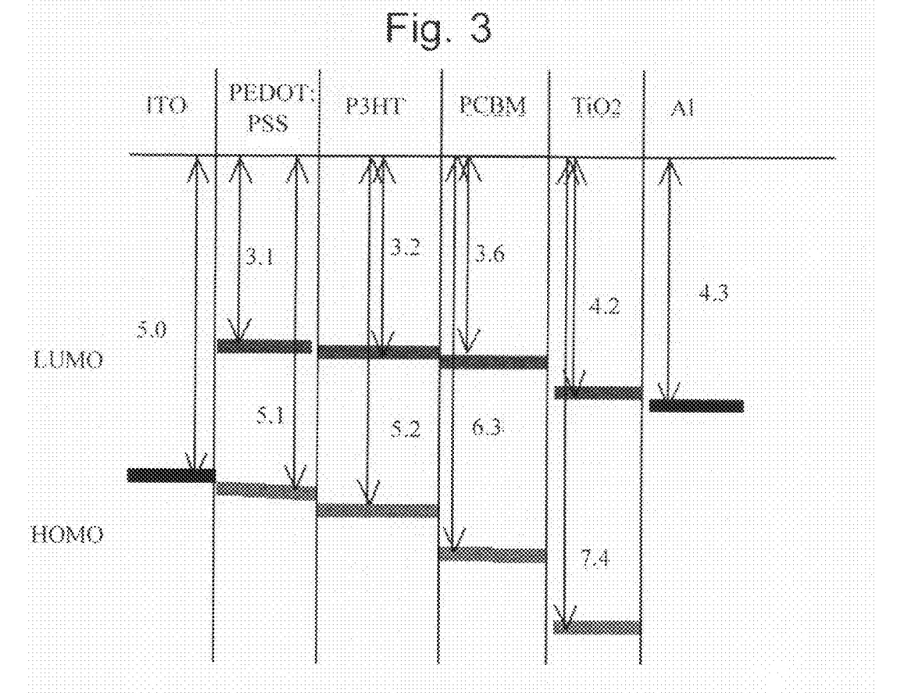
FIG. 3 is a graph of LUMO and HOMO energy levels of each layer, based on the vacuum level.

FIGS. 1 and 2 schematically show the structure of an organic thin-film solar cell as the first embodiment of the present invention. FIG. 3 shows HOMO and LUMO energy levels of each of ITO, PEDOT:PSS, P3HT, PCBM, TiO2 and Al layers at the vacuum level.

(Manufacturing Method)

A cleaned ITO (indium tin oxide) glass substrate as a transparent electrode was spin-coated with poly(3,4-ethylenedioxythiophene):poly(styrene sulfonic acid) (PEDOT:PSS). and dried for ten minutes at 110 degrees Celsius. Onto this coating, a chlorobenzene solution of a fullerene derivative ([6,6]-phenyl C61-butyric acid methyl ester) (PCBM) as an n-type organic semiconductor and poly(3-hexylthiophene) (P3HT) as a p-type organic semiconductor (at a weight ratio of 1:1; specifically, 5.0 mg/0.5 ml of PCBM and 5.0 mg/0.5 ml of P3HT) was applied by spin-coating and then dried for one hour at a reduced pressure of lower than 10 Pa to form a thin-film. The active layer thus formed was 100 nm in thickness. Onto this film, an ethanol solution of Ti alkoxide (Ti(OC3H7)4 (TIPT) was applied by spin-coating and then dried to form a TiO2 layer of approximately 50 nm in thickness. In this process, the TiO2 layer was air-dried without using heat, so that the TiO2 layer became an amorphous layer due to the moisture present in the air. Finally, an aluminum layer of 100 nm in thickness was vapor-deposited to form the counter electrode.

It should be noted that FTO or other materials can be used for the transparent electrode in place of ITO. However, ITO is the most preferable material in terms of conductivity and transparency.

(Thickness of the TiO2 Layer)

Figure 4:
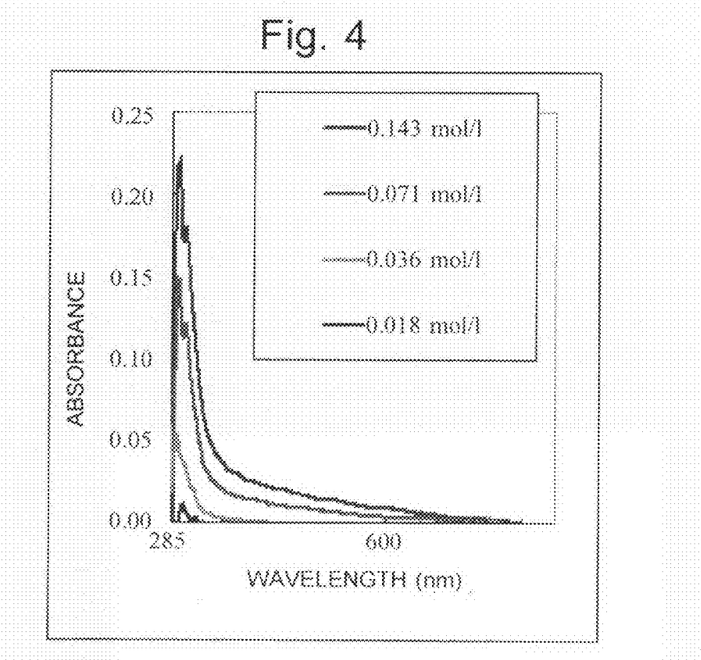
FIG. 4 is a graph of absorption spectrums for different TIPT concentrations; this graph was used for estimating the thickness of the TiO2 layer.

The thickness of the TiO2 layer was measured by UV-visible spectroscopy using an alpha stepper. FIG. 4 shows the absorption spectrum of the TiO2 layer. The layer thickness was controlled by changing the concentration of TIPT, which was used as titania precursor. The step profile enabled the concentration to be directly related to the thickness. For example, from an absorbance-thickness calibration curve, the thickness for a concentration of 0.143 mol/l was estimated as 150 to 170 nm and that for 0.071 mol/l as approximately 100 nm. These results suggest that the thickness for 0.036 mol/l is approximately 50 nm and that for 0.018 ml/l approximately 50 nm.

(Effect of TiO2 Layer on the Conversion Efficiency)

Figure 5:
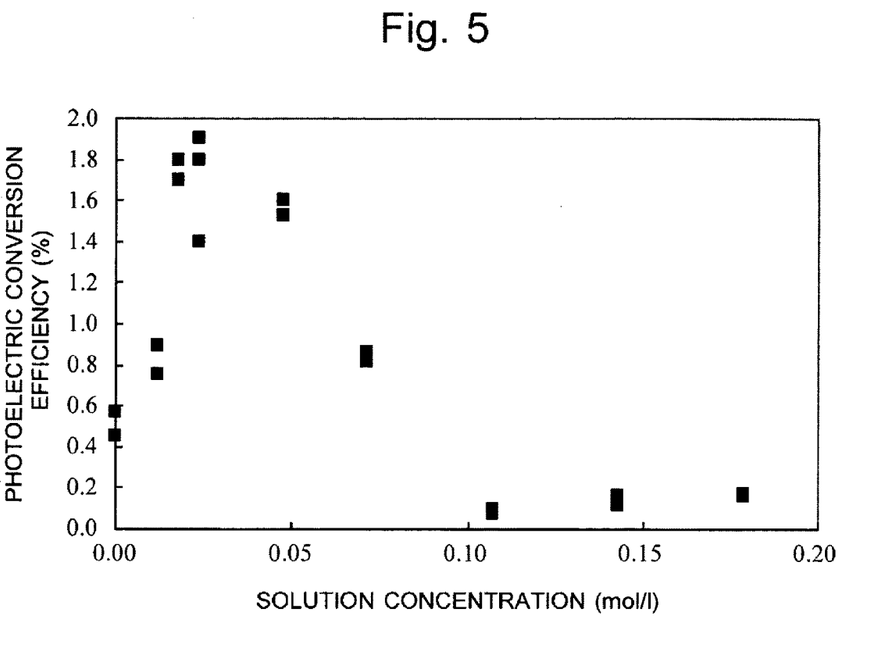
FIG. 5 is a graph showing a relationship between the TIPT concentration and photoelectric conversion efficiency.

FIG. 5 shows how the concentration of solution used in the manufacturing of the TiO2 layer affects the conversion efficiency. It shows that the conversion efficiency reaches the highest level when the TIPT concentration is within a range from 0.02 to 0.05 mol/l. It should be noted that this experiment used Denatron P-NHC (a product of Nagase ChemteX Corporation) as the PEDOT:PSS layer.

(Effect of Layers Made of Other Metal-Oxide Materials)

Figure 6:
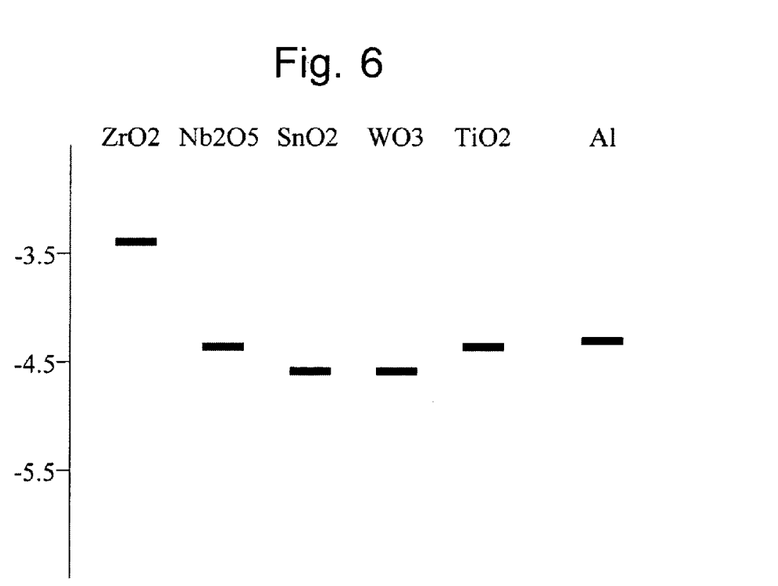
FIG. 6 is a chart showing the LUMO levels of ZrO2, Nb2O5, SnO2, WO3 and TiO2 based on the vacuum level, with the Fermi level of Al electrode for comparison.

To determine whether any MxOy layers other than TiO2 generally exhibit similar effects, the LUMO levels of ZrO2, Nb2O5, SnO2, WO3 and TiO2 were examined. FIG. 6 is a chart showing the LUMO levels of ZrO2, Nb2O5, SnO2, WO3 and TiO2 based on the vacuum level, with the Fermi level of Al electrode for comparison.

Figure 7:
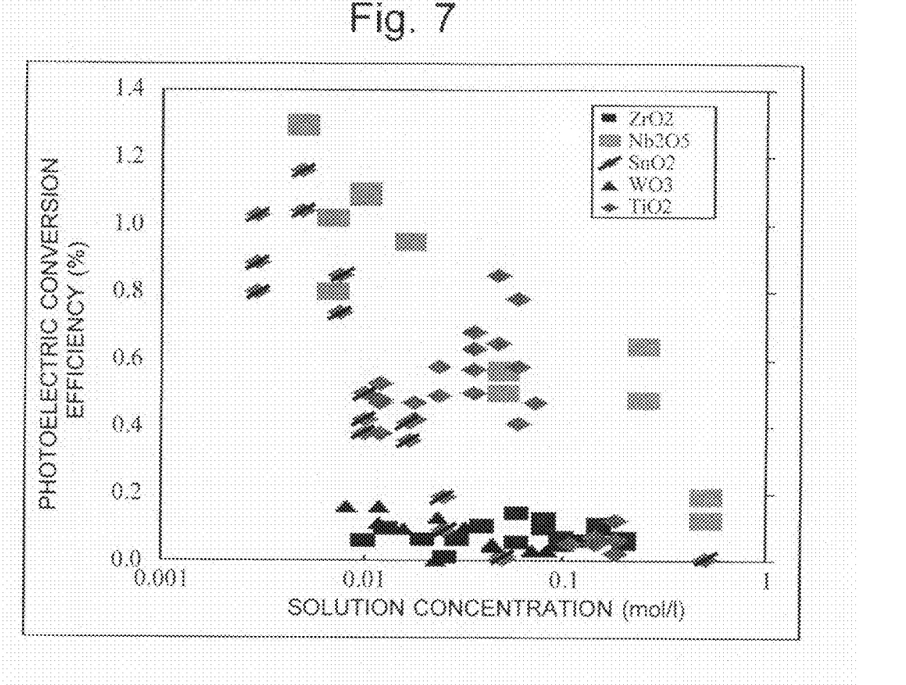
FIG. 7 is a graph of the photoelectric conversion efficiencies of various structures each having a different metal-oxide material between the active layer and the electrode.

For each of those metal-oxide materials (ZrO2, Nb2O5, SnO2 and WO3), a solution of the material at various concentrations was thinly applied on the photoelectric conversion layer by spin-coating and the photoelectric conversion efficiency was measured. As shown in FIG. 7, the efficiency was improved in every case, although the LUMO levels were closer to the Fermi level of aluminum. The results suggest that this improvement is also due to the effect of the hole-blocking layer. It should be noted that this experiment used Denatron #5002LA (a product of Nagase ChemteX Corporation) as the buffer layer.

Figure 8:
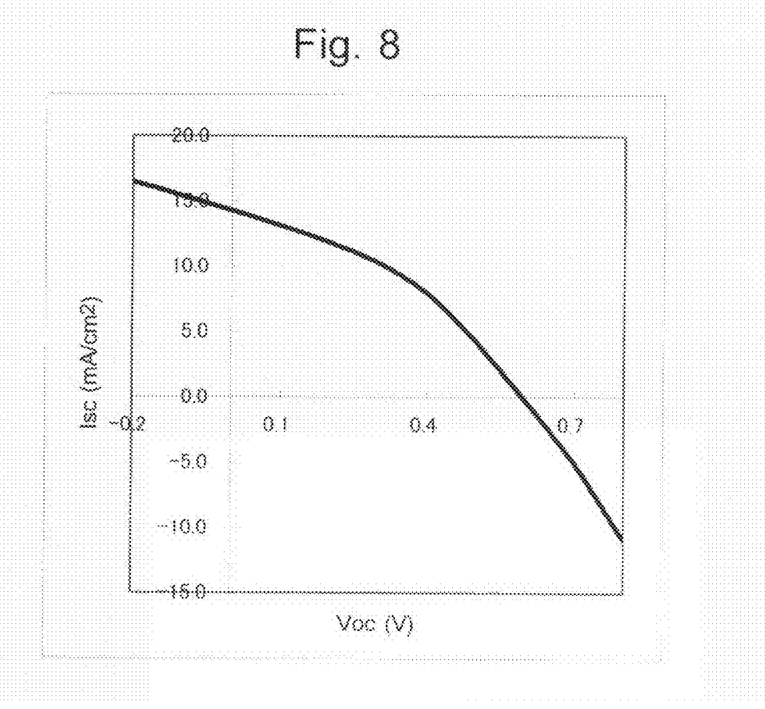
FIG. 8 is the I-V curve of a photoelectric conversion cell that exhibited the highest efficiency.

FIG. 8 shows the I-V curve of a photoelectric conversion cell that exhibited the highest efficiency. This cell achieved a conversion efficiency of 3%, with an open circuit voltage (Voc) of 0.6 V, short-circuit current of 14.2 mA/cm$^2$ and fill factor (FF) of 0.37.

Second Embodiment

Figure 9:
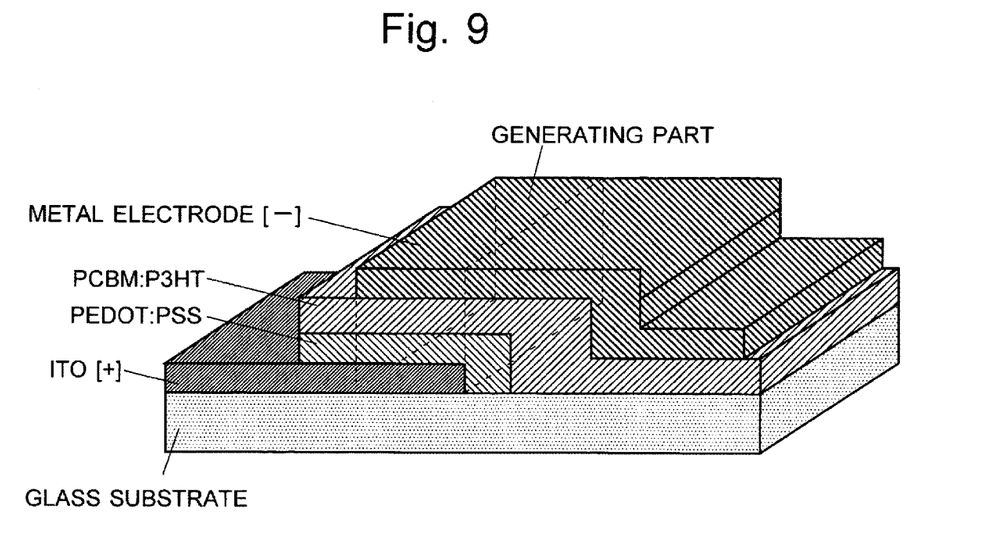
FIG. 9 is a perspective view of the structure of an organic thin-film photoelectric conversion element of the second embodiment.

As shown in FIG. 9, a glass substrate with an ITO electrode, which had been cleaned with acetone and ethanol, was coated with 150 μL of PEDOT:PSS by spin-coating at 5000 rpm. Then, 14 mg of P3HT and 6 mg of PCBM were dissolved in 1 mL of chlorobenzene (good solvent) and x mL of organic solvent (poor solvent), and 50 μL of this liquid mixture was applied by spin-coating at 2000 rpm, where the volume x of the organic solvent was varied. Finally, an aluminum film of 150 nm in thickness was created by vacuum deposition to obtain an organic thin-film photoelectric conversion element.

Figure 10:
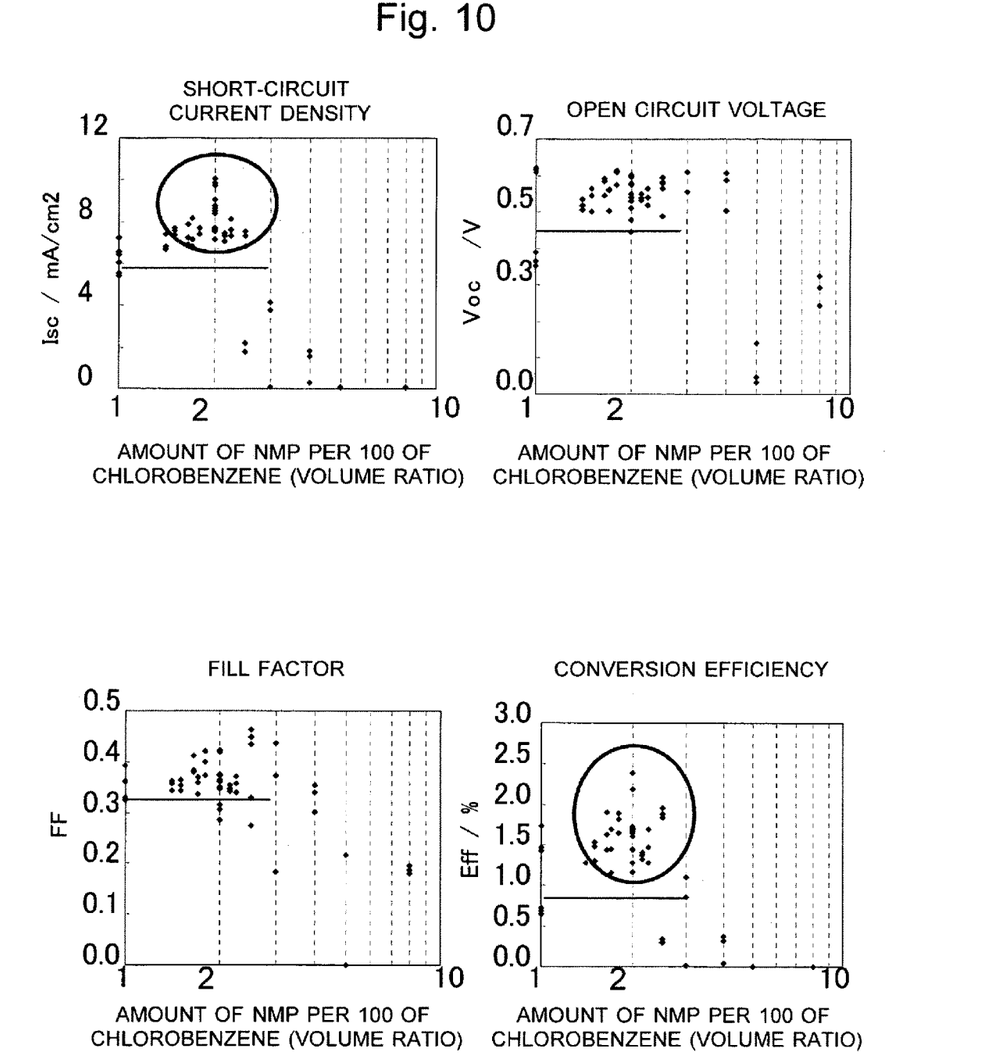
FIG. 10 shows graphs of the short-circuit current density Isc, open circuit voltage Voc, fill factor FF and conversion efficiency Eff of the organic thin-film photoelectric conversion element of the second embodiment.

FIG. 10 shows graphs of the short-circuit current density Isc, open circuit voltage Voc, fill factor FF and conversion efficiency Eff of the organic thin-film photoelectric conversion element of the present embodiment, where the quantitative ratio of the organic solvent (poor solvent) to chlorobenzene (good solvent) was changed. The aforementioned NMP (1-Methyl-2-pyrrolidone) was used as the poor solvent. When the quantitative percentage of NMP to chlorobenzene is within the range from 1.5 to 3%, the short-circuit current density Isc was almost always higher than 6 mA, and the current was even higher than 10 mA in some cases. Within the aforementioned range, the conversion efficiency was almost always higher than 1.0%, with the highest value at 2.4%.

Figure 11:
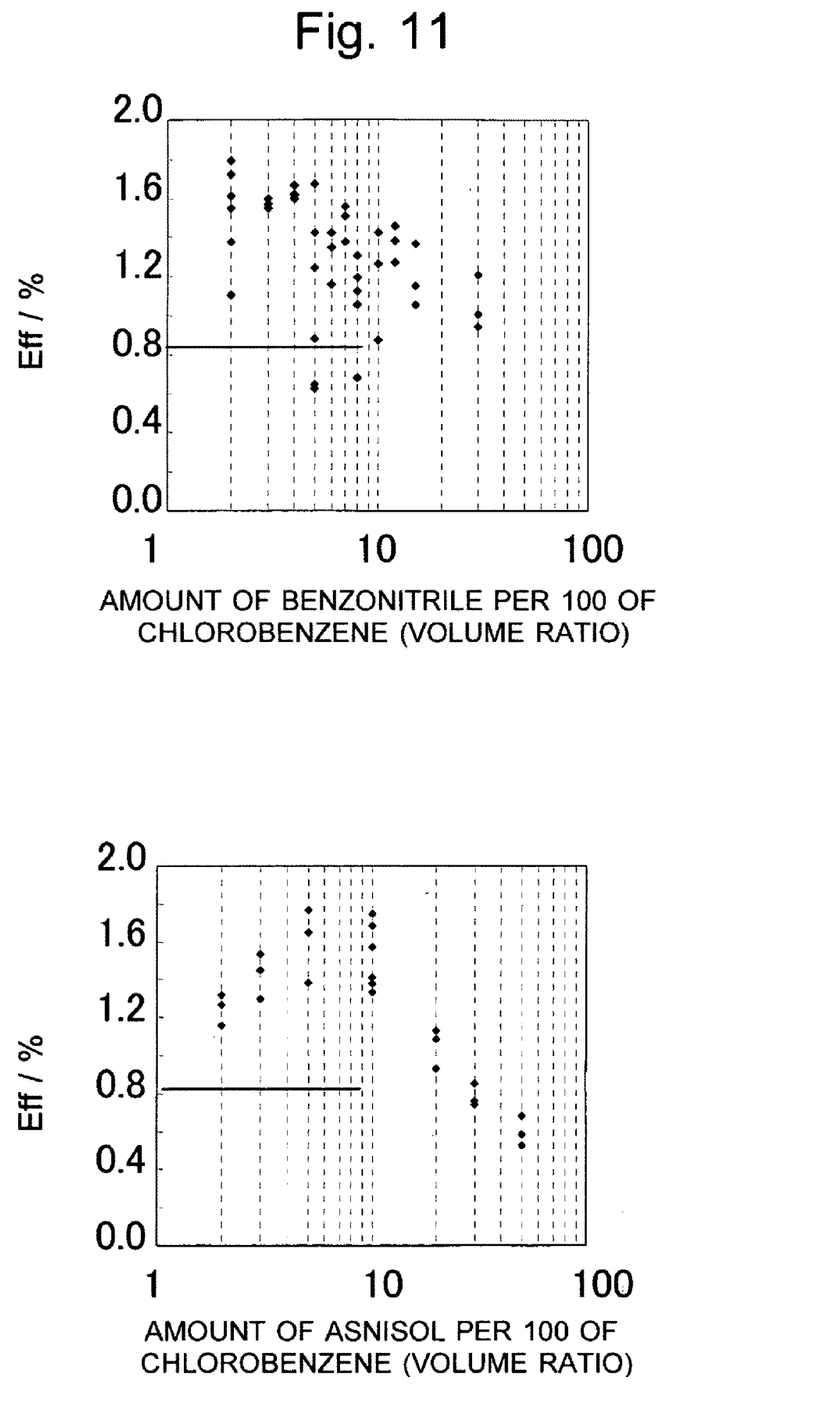
FIG. 11 shows graphs demonstrating how the conversion efficiency is affected by use of benzonitrile or anisole as poor solvent.

FIG. 11 demonstrates the result of an experiment for examining how the conversion efficiency is affected by the quantitative ratio of the organic solvent (poor solvent) to that of chlorobenzene (good solvent) in the case where benzonitrile or anisole is used as the poor solvent. These organic solvents also produced similar results: the conversion effect Eff was improved when the percentage of benzonitrile or anisole was within the range from 1 to 20%.

Figure 12:
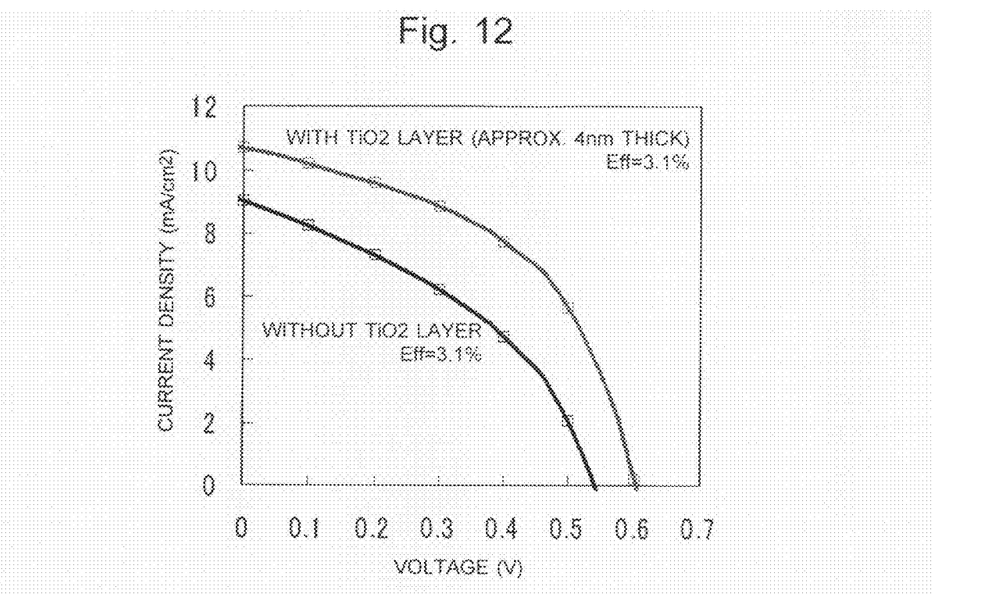
FIG. 12 is a graph of the voltage-current density characteristics of a device provided with a hole-blocking TiO2 layer and that of the same device without the hole-blocking TiO2 layer.

FIG. 12 shows the voltage-current density characteristics of these organic thin-film photoelectric conversion elements with a hole-blocking TiO2 layer added and that of the same elements without the hole-blocking layer. The graph clearly shows that the hole-blocking TiO2 layer has good effect on the photoelectric conversion efficiency.

Figure 13:
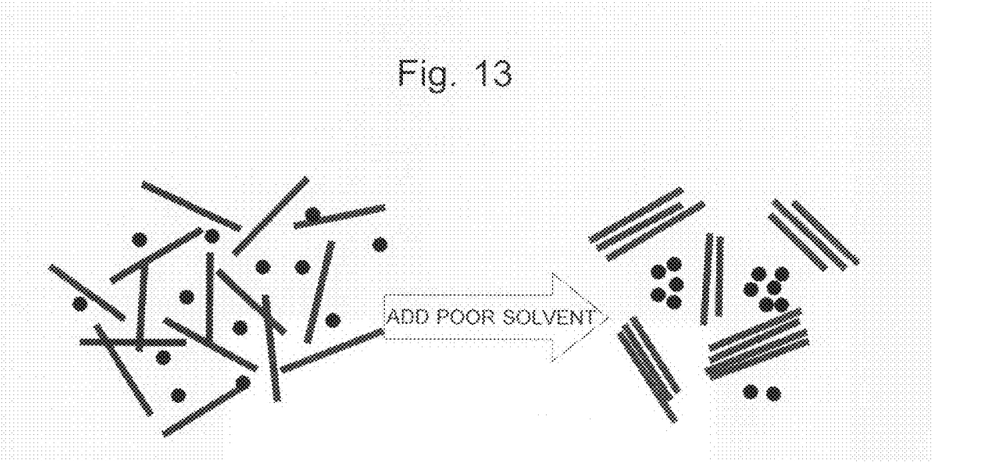
FIG. 13 is a schematic diagram showing how P3HT crystallizes when a poor solvent is added to a solution of P3HT:PCBM dissolved in a good solvent.

The improvement of the photoelectric conversion efficiency in the second embodiment is presumably achieved by the following mechanism: Addition of a poor solvent (e.g. NMP) to a solution of P3HT:PCBM dissolved in a good solvent (e.g. chlorobenzene) causes crystallization of P3HT, as shown in FIG. 13, due to which the conversion efficiency improves.

Figure 14:
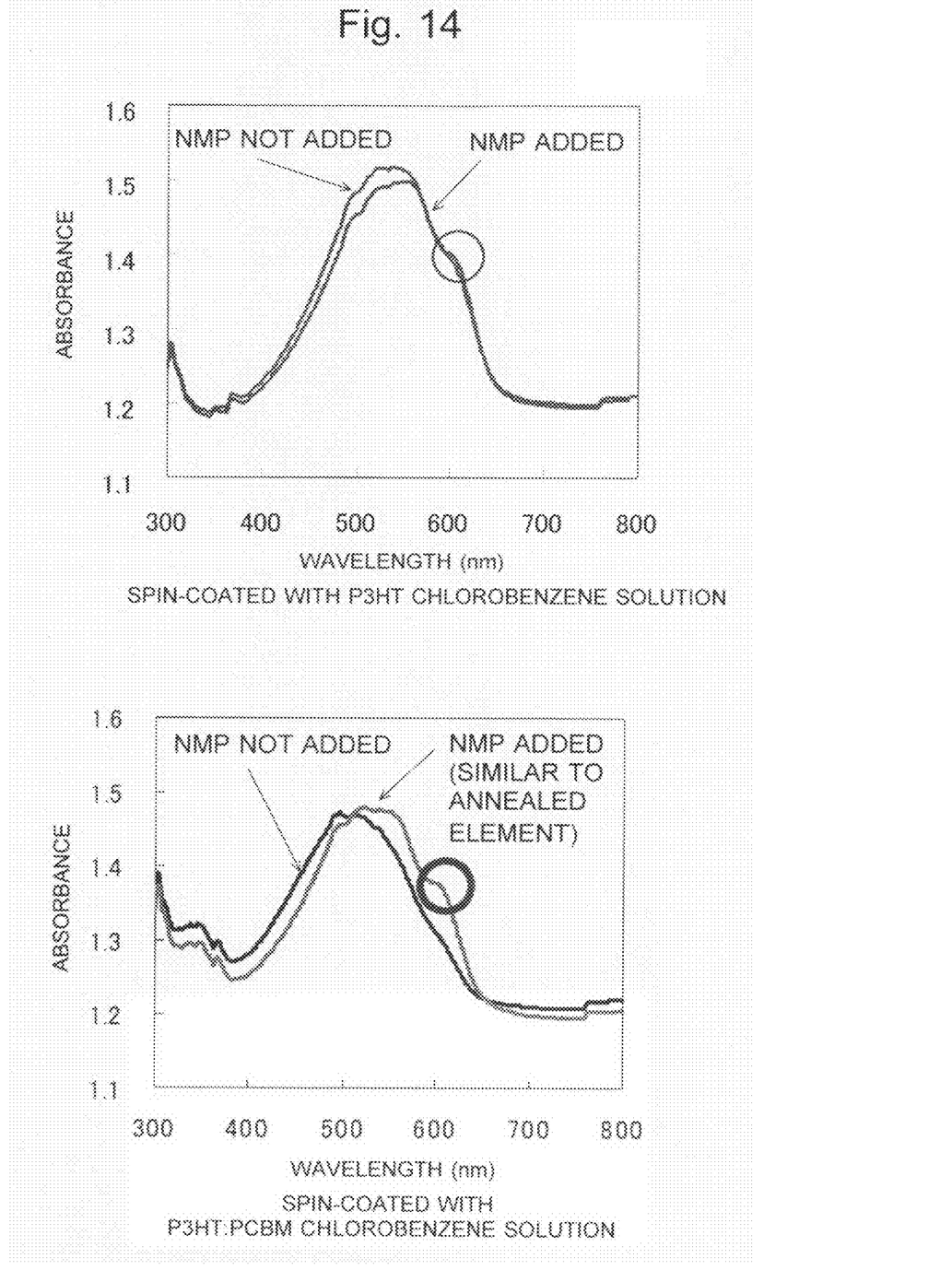
FIG. 14 shows the absorption spectrum of a thin film created using a chlorobenzene solution containing only P3HT as solute and that of a thin film created using a chlorobenzene solution containing P3HT:PCBM as solute.

To confirm this reasoning, the absorption spectrum of two thin-films were measured: one film was created by applying a solution in which only P3HT was dissolved in a good solvent (chlorobenzene) and the other film was created by applying another solution in which P3HT:PCBM was dissolved. Each of the two solutions was further divided into two samples; one sample had the poor solvent (i.e. NMP) added and the other sample did not. The result is shown in FIG. 14. The spectrum of P3HT:PCBM has a peak in the vicinity of 600 nm, as indicated by the circle. It is believed that this peak indicates the presence of crystallized P3HT.

Third Embodiment

Figure 15:
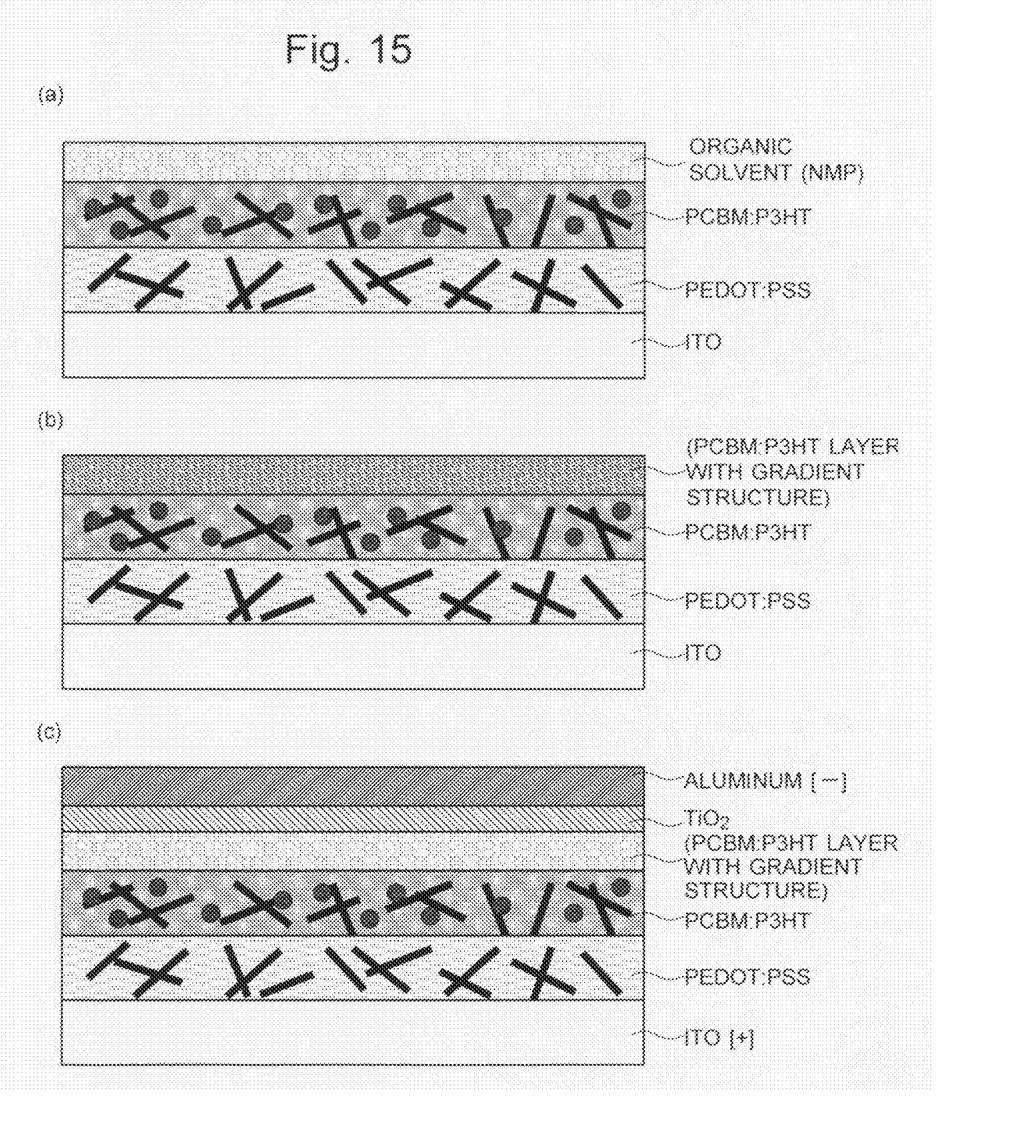
FIG. 15 is a cross-sectional view showing the manufacturing process of an organic thin-film photoelectric conversion element of the third embodiment in which the PCBM:P3HT layer has a gradient structure.

In the following embodiment, a gradient structure is given to the PCBM:P3HT layer. The inventors have found that the photoelectric conversion efficiency can be improved by providing the PCBM:P3HT layer (photoelectric conversion layer) with a concentration gradient of PCBM and P3HT along the thickness direction. This structure can be created by the following method (FIG. 15). First, as described previously, a PEDOT:PSS layer was formed on a cleaned ITO glass substrate as a transparent electrode. Then, a chlorobenzene solution of PCBM:P3HT at a weight ratio of 3 to 7 (specifically, 3 mg/0.5 ml of PCBM and 7 mg/0.5 ml of P3HT) was thinly applied by spin-coating and then dried for one hour at a reduced pressure of lower than 10 Pa to form the PCBM: P3HT layer. Its thickness was approximately 100 nm. Onto this layer, an organic solvent, 1-Methyl-2-pyrrolidone (NMP) was sprayed (or applied), as shown in FIG. 15(*a*). NMP is a solvent in which PCBM can be dissolved. Though its boiling point is higher than that of chlorobenzene, NMP can be distilled away at room temperature under a vacuum. As a result, in a region closer to the surface of the PCBM:P3HT layer, only the PCBM component is dissolved in NMP; thus, a gradient structure is created in the aforementioned region due to the concentration difference between the two materials. The gradient structure was fixed by leaving the PCBM:P3HT layer under a vacuum for a period of time from one hour to three days and then drying it, as shown in FIG. 15(*b*). Subsequently, as explained earlier, a TiO2 layer of approximately 50 nm in thickness was created by applying an ethanol solution of Ti alkoxide (Ti(OC3H7)4) (TIPT) by spin-coating and drying it. Finally, an aluminum layer of 100 nm in thickness was vapor-deposited to form the opposite electrode, as shown in FIG. 15(*c*).

In the process of creating the PCBM:P3HT layer, it is also possible to mix NMP in the chlorobenzene solution (specifically, 1.5 μL of NMP for 100 μL of chlorobenzene solution). Even without being annealed, the photoelectric conversion element manufactured by this method achieved a photoelectric conversion efficiency of 3.2%.

In the organic thin-film photoelectric conversion element having the gradient structure of the present embodiment, NMP (a solvent in which PCBM can be dissolved) is sprayed (or applied) onto the PCBM:P3HT layer. Therefore, in the vicinity of the layer, the solvent vaporizes in two stages: the good solvent, chlorobenzene, volatiles earlier, after which the poor solvent, NMP, gradually volatiles. This process helps the micro-crystallization of the photoelectric conversion material, P3HT. This crystallization leads to a reduction in the electrical resistance of that portion, which effectively minimizes the current loss within the photoelectric conversion element. In the vicinity of the hole-blocking TiO2 layer, the PCBM concentration is increased, which in turn makes it easier for electrons to flow into the TiO2 layer since PCBM is electrically conductive. These are presumably the reasons for the high photoelectric conversion efficiency of the organic thin-film photoelectric conversion element having the gradient structure of the present embodiment.

In the previous embodiment, the TiO2 layer was formed between the photoelectric conversion layer and the electrode layer, but thermal annealing was not performed on it. Thus, it has been confirmed that the photoelectric conversion layer with a gradient structure can achieve a high level of photoelectric conversion efficiency even without being thermally annealed.

Fourth Embodiment

A photoelectric conversion element was manufactured as follows: A cleaned ITO glass substrate as a transparent electrode was spin-coated with poly(3,4-ethylenedioxythiophene):poly(styrene sulfonic acid) (PEDOT:PSS) and dried for ten minutes at 110 degrees Celsius. Onto this coating, a chlorobenzene solution of a fullerene derivative ([6,6]-phenyl C61-butyric acid methyl ester) (PCBM) as an n-type organic semiconductor and poly(3-hexylthiophene) (P3HT) as a p-type organic semiconductor (at a weight ratio of 3:7; specifically, 3.0 mg/0.5 ml of PCBM and 7.0 mg/0.5 ml of P3HT) was applied by spin-coating and then dried for one hour at a reduced pressure of lower than 10 Pa to form a thin-film. The active layer thus formed was approximately 100 nm in thickness. Subsequently, this photoelectric conversion layer was heat-treated at a temperature of 140 degrees Celsius for five minutes. Onto this layer, an ethanol solution of Ti alkoxide (Ti(OC3H7)4) (TIPT) at a concentration of 0.036 mol/l was applied by spin-coating and then dried to form a TiO2 layer of approximately 50 nm in thickness. In this process, the TiO2 layer was air-dried without using heat, so that the TiO2 layer became an amorphous layer due to the moisture present in the air. Finally, an aluminum layer of 100 nm in thickness was vapor-deposited to form the opposite electrode.

Figure 16:
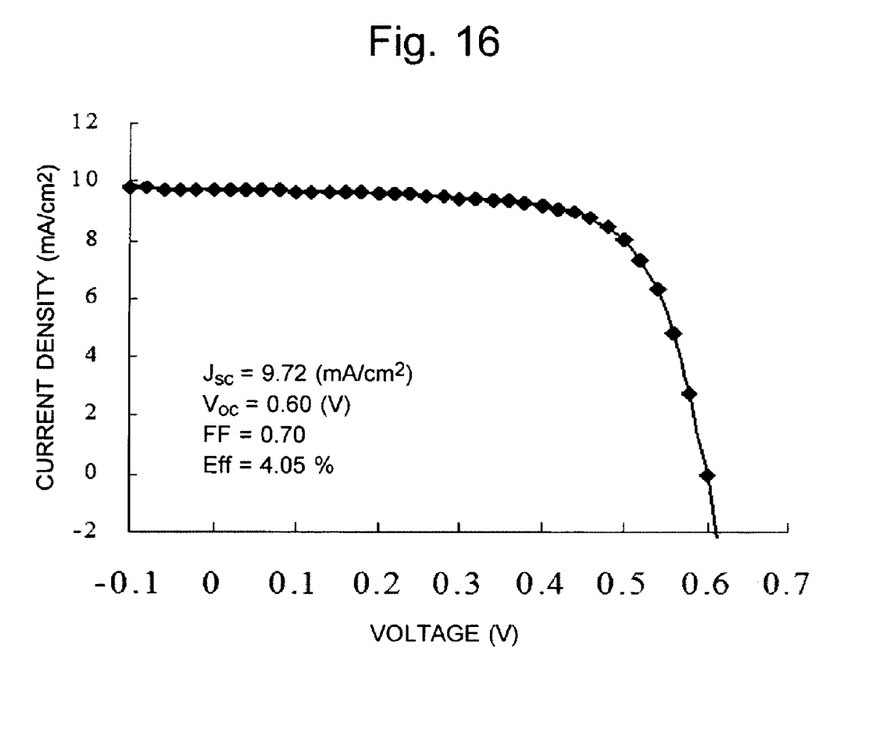
FIG. 16 shows the I-V curve of an organic thin-film solar cell having a TiO2 layer as the fourth embodiment.

FIG. 16 shows the IV characteristic of the photoelectric conversion element thus manufactured. As shown in this graph, the element had a fill factor of 0.7 and achieved a photoelectric conversion efficiency of 4.1%.

Figure 17:
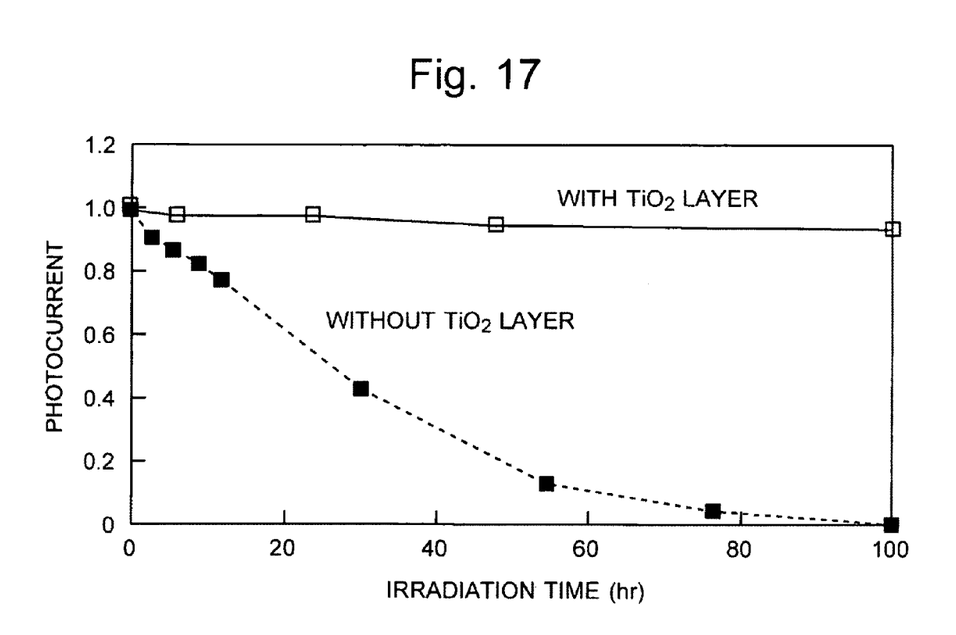
FIG. 17 is the decay curve of the photoelectric current generated in a cell with a TiO2 layer and in another cell without the TiO2 layer.

FIG. 17 shows the decay curve of the photoelectric current of the same element. For comparison, another photoelectric conversion element without the TiO2 layer between the photoelectric conversion layer and the electrode was manufactured and tested under the same conditions. The elements were set under normal atmosphere and continuously irradiated with light of air mass 1.5 spectrum having an intensity of 100 mW/cm$^2$. As shown in FIG. 17, owing to the TiO2 layer, the decaying rate of the photoelectric conversion efficiency of the element according to the present invention was as low as 6% even after 100 hours and without using a ceiling. In contrast, in the normal bulk-heterojunction PCBM:P3HT photoelectric conversion element without the TiO2 layer, the photoelectric current weakened by 17% in as short a period of time as 8 hours and became nearly zero after 80 hours. These results prove that the organic thin-film photoelectric conversion element of the present embodiment is much more durable than the conventional one.

(Function of TiO2)

Figure 18:
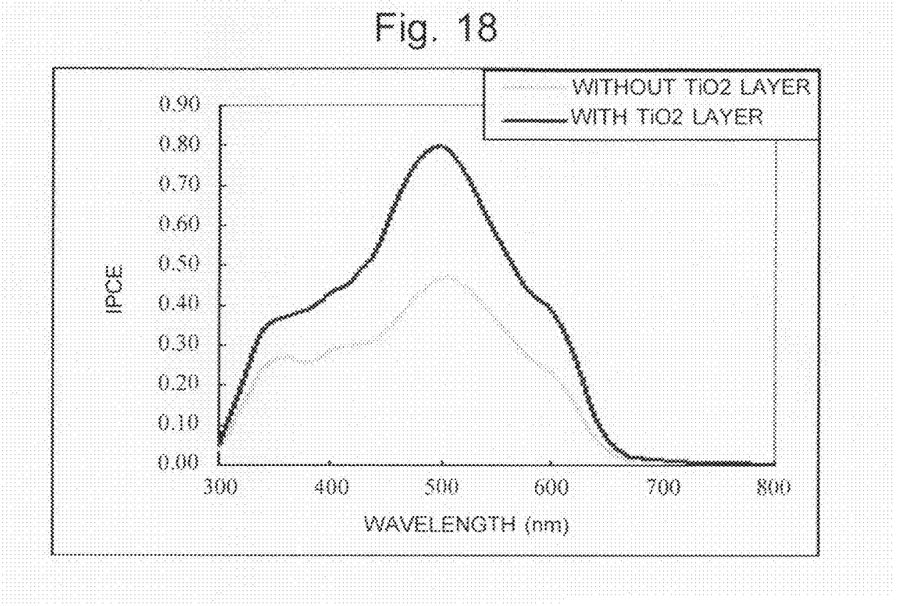
FIG. 18 is a graph showing the IPCE spectrum of the cell with the TiO2 layer and that of the other cell without that layer, both of which were annealed.
Figure 19:
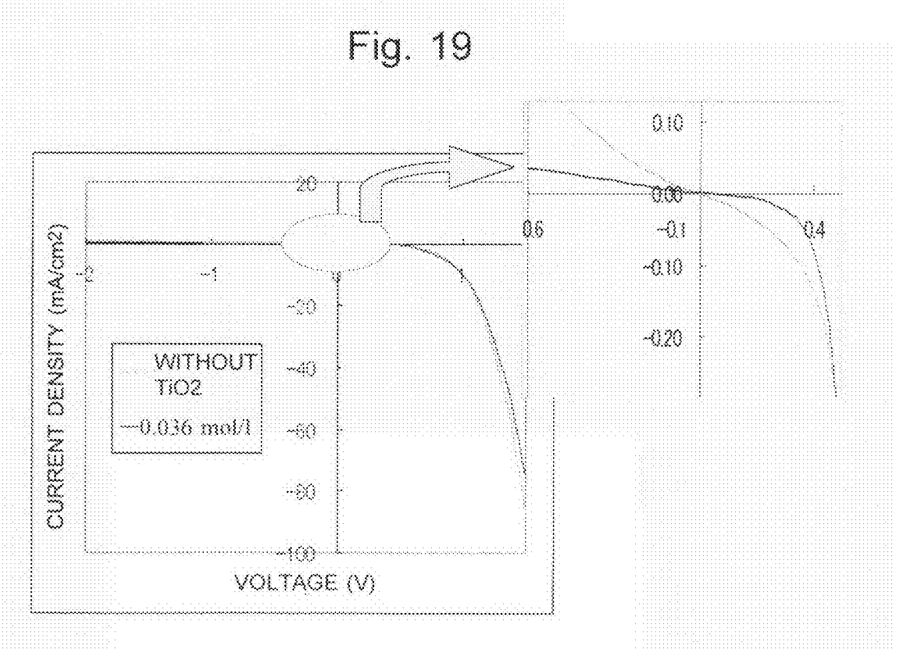
FIG. 19 shows I-V curves obtained in a dark environment in two cases: one case with the TiO2 layer and the other case without it.

FIG. 18 shows the IPCE spectrum (photoelectric current spectrum) of the cell having the TiO2 layer and that of the other cell without that layer, both of which were annealed, and FIG. 19 shows I-V curves obtained in a dark environment in two cases: one case with the TiO2 layer and the other case without it. The two figures show that the TiO2 layer does not absorb light; it blocks the hole current between the active layer and the aluminum electrode, thereby raising the level of reverse current barrier.

The invention claimed is:

1. A method of manufacturing an organic thin-film photoelectric conversion element, comprising:
    creating a buffer layer and a photoelectric conversion layer on a substrate having an electrode under normal atmosphere;
    providing a hole-blocking TiO2 layer on the photoelectric conversion layer by wet process without heating; and
    providing an opposite electrode on the hole-blocking TiO2 layer,
    wherein the photoelectric conversion layer is provided with a concentration gradient of an n-type organic semiconductor component and a p-type organic semiconductor component across a thickness of the photoelectric conversion layer, and
    the concentration gradient on the photoelectric conversion layer is created by applying a poor solvent on the photoelectric conversion layer after the photoelectric conversion layer is created and then vaporizing the poor solvent, where:
        the poor solvent is a solvent in which the n-type organic semiconductor component can be dissolved;
        the poor solvent has a boiling point higher than that of a good solvent used in a process of creating the photoelectric conversion layer; and
        the poor solvent can be distilled away at room temperature.

2. The method of manufacturing an organic thin-film photoelectric conversion element according to claim 1, wherein the hole-blocking TiO2 layer is created by applying a solution of Ti alkoxide and then drying it at room temperature.

3. The method of manufacturing an organic thin-film photoelectric conversion element according to claim 2, wherein the hole-blocking TiO2 layer is created by using a Ti alkoxide solution in which Ti alkoxide is dissolved in ethanol in concentrations from 0.02 to 0.05 mol/l.

4. The method of manufacturing an organic thin-film photoelectric conversion element according to claim 1, wherein the n-type organic semiconductor component is PCBM, the p-type organic semiconductor component is P3HT, the good solvent is chlorobenzene, and the poor solvent is one of NMP, benzonitrile and anisole, or a mixture of two or more from the group consisting of NMP, benzonitrile and anisole.

5. The method of manufacturing an organic thin-film photoelectric conversion element according to claim 1, wherein the photoelectric conversion layer is created using a solution in which PCBM as the n-type organic semiconductor component and P3HT as the p-type organic semiconductor component are dissolved in the good solvent consisting of chlorobenzene and the poor solvent consisting of one of NMP, benzonitrile and anisole, or a mixture of two or more from the group consisting of NMP, benzonitrile and anisole.

6. The method of manufacturing an organic thin-film photoelectric conversion element according to claim 1, further comprising an annealing process carried out after the photoelectric conversion layer is created.

* * * * *